United States Patent [19]
Ebitani et al.

[11] Patent Number: 5,229,626
[45] Date of Patent: Jul. 20, 1993

[54] SOLID-STATE IMAGE CONVERTING DEVICE WITH DOT-LIKE LAYER

[75] Inventors: Masuyuki Ebitani; Toshihumi Tominaga, both of Anan, Japan

[73] Assignee: Nichia Kagaku Kogyo K.K., Tokushima, Japan

[21] Appl. No.: 858,526

[22] Filed: Mar. 27, 1992

[51] Int. Cl.⁵ .................................. H01L 27/14
[52] U.S. Cl. ........................ 257/84; 257/447; 257/85; 257/448; 250/370.09; 250/370.11
[58] Field of Search .......... 257/443, 447, 448, 449, 257/84, 85, 98, 428; 250/370.09, 370.08, 208.1, 370.11, 367, 368; 378/62, 63

[56] References Cited

U.S. PATENT DOCUMENTS

| | | | |
|---|---|---|---|
| 3,790,867 | 2/1974 | Hayakawa | 257/84 X |
| 3,902,185 | 8/1975 | Hayakawa | 257/84 X |
| 4,940,901 | 7/1990 | Henry et al. | 250/370.09 |
| 4,948,978 | 8/1990 | Guyot | 250/370.11 |
| 4,980,553 | 12/1990 | Henry | 250/370.09 X |
| 5,001,532 | 3/1991 | Petroff | 257/443 X |

FOREIGN PATENT DOCUMENTS 49-3037  1/1974 Japan.
2-223194 9/1990 Japan.
2-236992 9/1990 Japan.

OTHER PUBLICATIONS

Uchida et al., "Design of a Mosaic BGO Detector System for Positron CT," IEEE Transactions on Nuclear Science, vol. NS-33, No. 1, Feb. 1986, pp. 1-4.

Primary Examiner—William Mintel
Attorney, Agent, or Firm—Nixon & Vanderhye

[57] ABSTRACT

A solid-state image converting device comprises a transparent substrate, a transparent electrode formed on the transparent substrate, an EL layer, formed on the transparent electrode, emitting light by the application of an electric field, a dot-like low resistance layer formed on the EL layer, a photoconductive layer formed on the dot-like low resistance layer, and a back electrode formed on the photoconductive layer. A radiation image entered the transparent substrate or the back electrode is converted into a visible light image having high brightness on the back electrode or the transparent substrate.

14 Claims, 3 Drawing Sheets

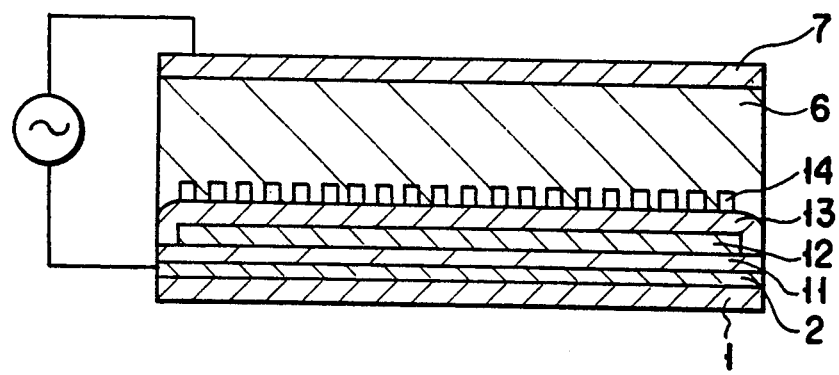
F I G. 2

SOLID-STATE IMAGE CONVERTING DEVICE WITH DOT-LIKE LAYER

BACKGROUND OF THE INVENTION

1. Field of the Invention

The present invention relates to a solid-state image converting device and particularly to a solid-state image converting device converting a radiation image of a non-visible wavelength such as an infrared ray, an X-ray and a γ-ray into a visible light image.

2. Description of the Related Art

In general, as shown in FIG. 1, a solid-state image converting device has the structure in which a transparent substrate 1, a transparent electrode 2, an electroluminescent layer 3, a reflecting layer 4, a non-transmitting layer 5, a photoconductive layer 6 (hereinafter called as a PC layer), and a back electrode 7 are sequentially laminated. This type of the solid-state image converting device converts the non-visible wavelength image into the visible image by the following principle.

An X-ray image is radiated from the side of the back electrode 7 in a state that an alternating voltage of 400 to 500V is applied between the transparent electrode 2 and the back electrode 7. In a state that no X-ray image is radiated, the electroluminescent layer 3 is light emitted since most of the applied voltage is applied to the PC layer 6 having high resistivity of tens of MΩcm. However, when the X-ray image is radiated, the resistivity of the PC layer 6 is decreased in accordance with the increase in exposure does of the X-rays. Due to this, a part of the applied voltage is distributed to the electroluminescent layer 3. Then, the electroluminescent layer 3 exceeds the starting voltage for light-emission, thereby a converted output image can be obtained on the side of the transparent substrate 1. At this time, the reflecting layer 4 and the non-transmitting layer 5 are provided in order to prevent optical feedback applied to the PC layer 6 from the electroluminescent layer 3. That is, these are provided to prevent the image from being not formed on the side of the transparent substrate 1 because of the fact that light generated by the electroluminescent layer 3 is returned to the PC layer 6.

In the above-structured image converting device, the layers other than electrodes 2 and 7 are formed by dispersing powder material in an organic binder and applying the dispersion by a screen printing and the like. The layer structure, which is formed by such a method, is generally called as a dispersion type. The film thickness normally ranges from tens of μm to hundreds of μm. Therefore, the above structured solid-state image converting device is called as a dispersion-type solid-state image converting device. The dispersion-type solid-state image converting device, however, has the following problems.

(1) Uniformity of a light emitting surface is determined depending on mainly the size of particles of phosphor constituting the electroluminescent layer 3, the dispersing state, and the applying film thickness.

(2) Since the film thickness of the PC layer 6 is large (hundreds of μm), a large applied voltage is needed.

(3) Since the electroluminescent layer 3 is the dispersion type, its luminance is low and its life time is short.

(4) Since the electroluminescent layer 3, the reflecting layer 4, and the non-transmitting layer 5 are provided, the radiation ray from the side of the transparent substrate 1, is not transmitted.

(5) Since the thin film, which is formed by depositing metal, is used as the back electrode 7, an excitation efficiency of the PC layer 6 by the radiation ray from the back side is low.

Particularly, due to problems (4) and (5), in an actual situation, only a solid-state X-ray image converting device having high transmissivity to the back electrode 7 is put into practical use at present.

SUMMARY OF THE INVENTION

An object of the present invention is to provide a solid-state image converting device which can obtain an image having high luminance with high sensitivity.

Another object of the present invention is to provide a solid-state image converting device which can convert not only a γ-ray and an X-ray but also near infrared, intermediate infrared and far infrared images into a visible image.

According to the present invention, there is provided a solid-state image converting device which comprises a transparent substrate; a transparent electrode formed on the transparent electrode, a dot-like low resistance layer formed on the EL layer; a photoconductive layer formed on the dot-like low resistance layer; and a back electrode formed on the photoconductive layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a schematic cross sectional view showing the structure of a solid-state image converting device according to an embodiment of the present invention;

DETAILED DESCRIPTION OF THE PREFERRED EMBODIMENTS

Figure 1:
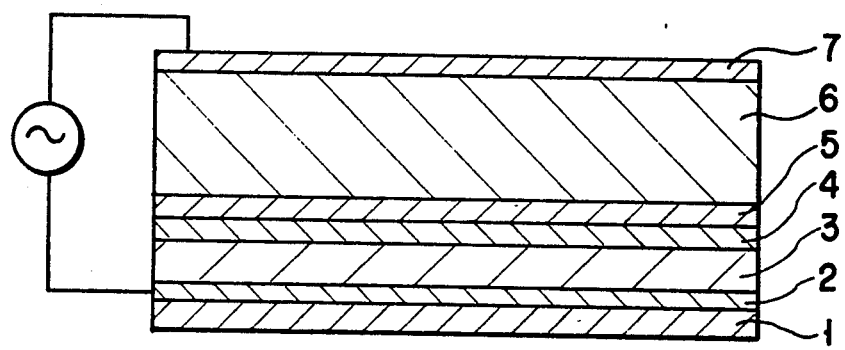
FIG. 1 is a schematic cross sectional view showing the structure of a conventional solid-state image converting device.

Various embodiments of the present invention will be explained with reference to the drawings.

FIG. 2 is a schematic cross sectional view showing an example of a solid-state image converting device of the present invention. In FIG. 2, the solid state image converting device has the structure in which a transparent substrate 1, a transparent electrode 2, a first dielectric layer 11, a thin film light-emitting layer 12, a second insulating layer 13 (these layers 11, 12 and 13 constitute a double insulating type thin film EL), a dot low resistance layer (hereinafter called as a dot layer) 14, a PC layer 6, and a back electrode 7 are sequentially laminated.

In the solid-state image converting device shown in FIG. 2, any of the transparent electrode 2, the first insulating layer 11, the thin film light-emitting layer 12, the second insulating layer 13, the dot layer 14, and the back electrode 7 can be formed by a vacuum evaporation or sputtering.

As a material constituting the transparent electrode 2, there can be used $In_2O_3$, $SnO_2$, ITO (indium-tin oxides), and AZO (aluminum doped zinc oxide), and the like. As materials constituting the insulating layers 11 and 13, there can be used at least one metal oxide selected from the group consisting of Al, Si, Ti, Ta, rare earth metals, and alkali earth metals, or a mixture of these metals. As such an oxide, there can be listed $Y_2O_3$, $Al_2O_3$, $Ta_2O_5$, $PbNb_2O_6$, $BaTiO_3$, and the like.

As a material constituting the thin film light-emitting layer, there can be a normal thin film EL light-emitting material such as ZnS:Tb.F, ZnS: Mn and the like. As a material constituting the back electrode 7, there can be used metals such as Al, Au and the like, and the same material as one used as the transparent electrode 2 if transmissivity is required.

As a material constituting the dot layer 14, there can be used metals such as Al, Au, Pt, Zn, Ag, Cu, Ni, and the like, and transparent conductive material such as ITO, AZO, and $SnO_2$. The dot layer 14 can be formed on the second insulating layer 13 to have a thickness of, preferably 0.01 to 5 $\mu$m, more preferably 0.1 to 1 $\mu$m by evaporation spattering, via a dot mask or a lift-off method using a photoresist. Moreover, the dot layer can be formed by photoetching.

The size of the dot of the dot layer is preferably 20 to 300 $\mu$m, and more preferably 50 to 120 $\mu$m and the distance between dots is preferably 20 to 300 $\mu$m, more preferably 50 to 120 $\mu$m.

The PC layer 6 can be formed by dispersing powder of CdSe:Cu, Cl in an organic binder, and applying the dispersion on the dot layer 14. CdSe:Cu, Cl originally have a peak of sensitivity in the near infrared region. Moreover, CdS, PbS, PbSe are used as other photoconductor, and each has the peculiar sensivity thereof. Due to this, the photoconductor can be used depending on the wavelength of the radiation to be converted.

Since the double insulating type thin film EL has the best stability and the best luminance at present, it is widely used as a layer emitting light by the application of the electric field. Other types of thin film EL, can also be used.

Figure 3A:
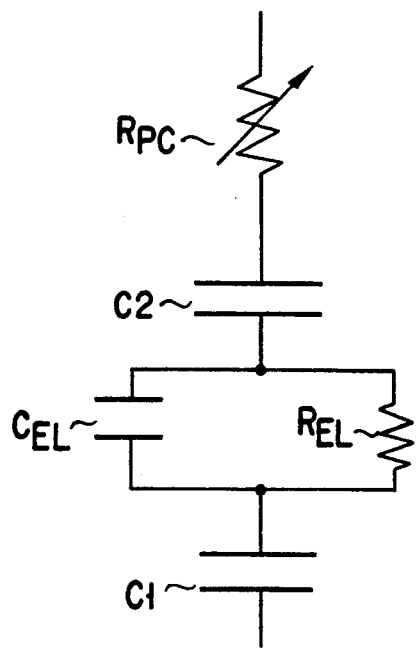
FIGS. 3A and 3B are electrical circuit diagrams showing an operation of a dot layer according to the present invention.
Figure 3B:
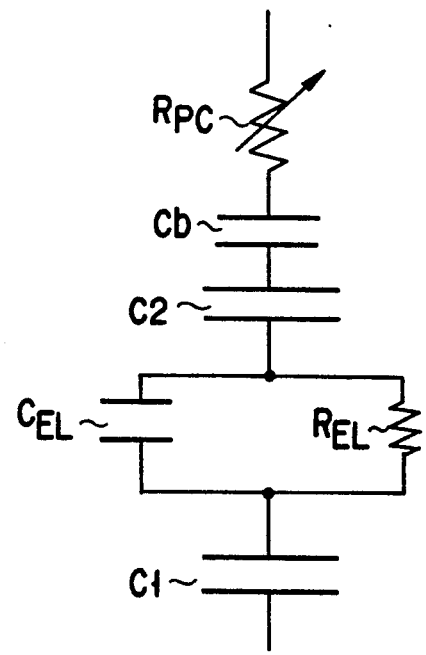

An operation of the dot layer 14 in the solid-state image converting element of the present invention shown in FIG. 2 will be explained with reference to circuit diagrams shown in FIGS. 3A and 3B. FIG. 3A is a circuit diagram of a portion where the dot layer 14 is formed, and FIG. 3B is the circuit of a portion where no dot layer 14 is formed. In FIGS. 3A and 3B, the PC layer 6 is expressed by a variable resistance R PC in which a resistance value changes depending on excitation light. The double insulating type thin film EL is expressed by an equivalent circuit in which a parallel circuit comprising a capacity $C_{EL}$ of the emitting-light layer and a non-linear resistance $R_{EL}$ is connected in series between capacities C1 an C2 of two insulating layers. As shown in these circuits, the PC layer 6($R_{PC}$) and the thin film EL are connected in series. The PC layer is formed by applying photoconductive powder to the dot layer 14 in a state that photoconductive powder is dispersed in the insulating organic binder. Due to this, the boundary face between the PC layer and the second insulating layer 13 of the thin film EL layer does not constitute a plane, and point contact is made in the boundary face. Many spaces, therefore, exist in the boundary face, and electrostatic capacity is generated in the boundary face equivalently.

Therefore, as shown in FIG. 3B, if the PC layer 6 is directly formed on the second insulating layer 13, capacitance Cb is further generated on capacity C2 of the contacted surface. As shown in FIG. 3A, however, even if photoconductive powder point-contacts the low resistance dot layer 14 in the portion where the low resistance dot layer 14, capacity such as Cb is not generated. Or, if capacity is generated, inpedance is small enough to be neglected as compared with Cb. This is because the dot layer 14 face-contacts the second insulating layer 13. In FIGS. 3A and 3B, the resistance value of the low resistance dot layer 14 itself is small enough to be neglected as compared with that of the PC layer 6, the resistance value is omitted.

Accordingly, as compared with the portion where the dot exists, starting voltage for EL light-emission increases by tens of voltages against the same quantity of incident light in the portion where no dot exists. In other words, even if the PC layer 6 is excited by the incident light, only the EL layer, which corresponds to the portion where the low resistance dot layer 14 exists, radiates light, and the portion where no low resistance dot layer 14 exists does not radiate light since capacity Cb of the boundary face exists. If the solid-state image converting device is constituted without the dot layer 14, the voltage to be applied to the overall device till the light-emission is started is increased, and the EL layer and the PC layer 6 are easily broken.

Moreover, in the conventional dispersion type solid-state image converting device, the excitation of the PC layer 6 due to the positive feedback of the EL light-emission is prevented by the non-transmitting layer having a large resistivity value ($10^6$ to $10^{11}\Omega$cm). In the dispersion type solid image converting device of the present invention, if the EL light-emission is positively fed back to the portion where no dot layer 14 exists from the electroluminescent layer, the voltage does not reach to the starting voltage for the light-emission and no light-emission is generated since capacity Cb (portion where no dot layer 14 exists) of the boundary face exists.

As mentioned above, according to the dispersion type solid-state image converting device of the present invention, the portion of the EL layer, which corresponds to the portion excited by the incident light image, radiates light in a dot form. As a result, the dot-like image can be obtained.

If the dot layer 14 is formed of the transmitting material, light is passed through the thin film EL or the dot layer 14, so that even the near infrared image having a wavelength of about 1 $\mu$m sent from the side of the transparent substrate 1 can be converted into the visible radiation image.

Figure 4:
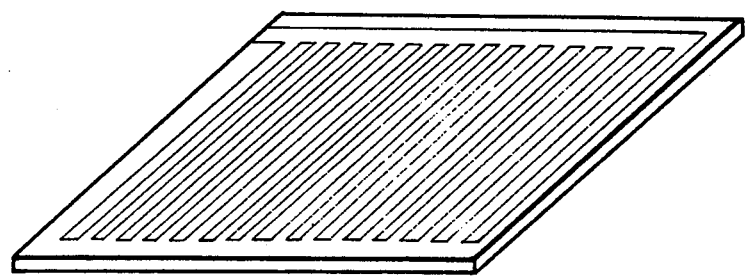
FIG. 4 is a schematic cross sectional view showing the structure of a striped transparent electrode according to the present invention.

In a case of intermediate infrared ray having a wavelength of 1.4 $\mu$m to 5 $\mu$m the infrared ray entered from the side of the transparent substrate 1 is reflected on or absorbed in ITO or AZO, which are the transparent electrode 2, before the infrared ray reaches to the PC layer 6. As shown in FIG. 4, therefore, if the transparent electrode 2 is stripedly formed, the infrared image can be reached up to the PC layer 6. Even if the transparent electrode 2 is reticulately formed, the infrared ray can be passed through in the same manner.

The transparent electrode 2 can be stripedly or reticulately formed by photoetching, or evaporation spattering through the mask or the lift off method. The size of the stripe, the width of the reticulation, and the pitch are not particularly limited, but they are preferably approximately the same as the size of the dot of the dot layer 14 or smaller than that of the dot of the dot layer 14 so as to improve resolution.

Figure 5:
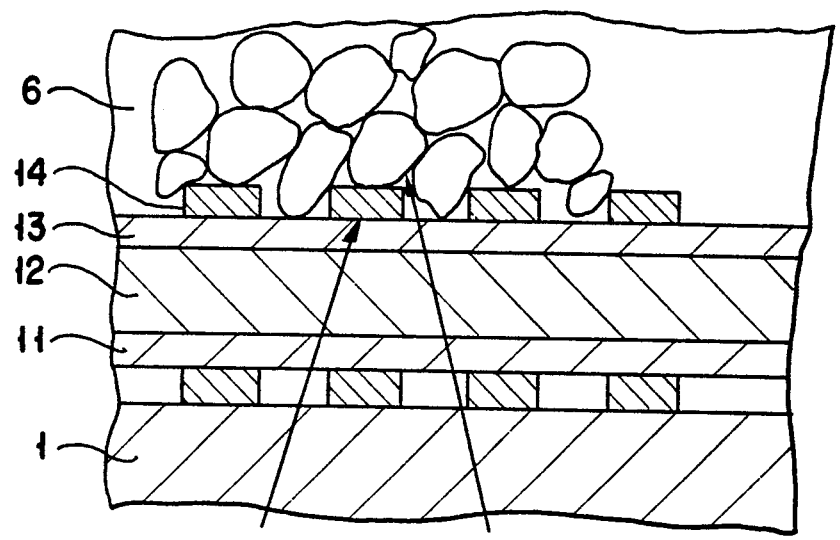
FIG. 5 is a schematic cross sectional view showing a partially enlarged solid-state image converting device according to the present invention.

FIG. 5 is a cross sectional view showing a partially enlarged solid state image converting device of the present invention wherein the transparent electrode 2 is stripedly formed and the dot layer 14 is formed. As shown in FIG. 5, the intermediate infrared incident light, which are entered from the side of the transparent substrate 1, pass throuqh the stripe and reach to the dot layer 14. Such light reaching to the dot layer 14 includes a light component which directly strikes on the dot layer 14 in an oblique manner, and another light component which strikes on the portion where no dot layer 14 exists. Incident light, which strikes on the dot layer 14, is reflected on or absorbed in ITO constituting the dot layer 14, but incident light, which strikes on the portion where not dot layer 14 exists, is propagated through the particles constituting the PC layer 6 and reaches to the PC layer 6 on the dot layer 14.

The particle of the stimulated PC layer 6 is started to radiate light by distributing the voltage to the thin film EL layer where the dot and the stripe are superimposed. The portion where no dot layer 14 exists, however, does not radiate light since capacity $C_b$ of the boundary face exists.

Similar to the case in which the transparent electrode 2 is stripedly or reticulately formed, even in a case where the back electrode 7 is stripedly or reticulately is formed, the wavelength of intermediate infrared ray or more passes through the stripe of the back electrode 7 and reticulation, and stimulates the the PC layer 6, so that only the EL layer corresponds to the portion where the stripe or reticulation and the dot, radiates light. In a case where the striped or reticulated back electrode 7 is directly formed on the dispersion type PC layer 6, it is difficult to form the stripe and the like by the lift off method or photoetching since a washing process is required during the overall processes and the PC layer 6 is peeled in the washing process. Therefore, in this case, a transparent substrate such as a glass plate is provided in the back surface and the ITO is stripedly or reticulately is formed on the transparent substrate similar to the transparent electrode 2, thereafter, preferably, the PC layer 6 and the ITO layer are opposed to each other to be closely adhered.

Figure 6:
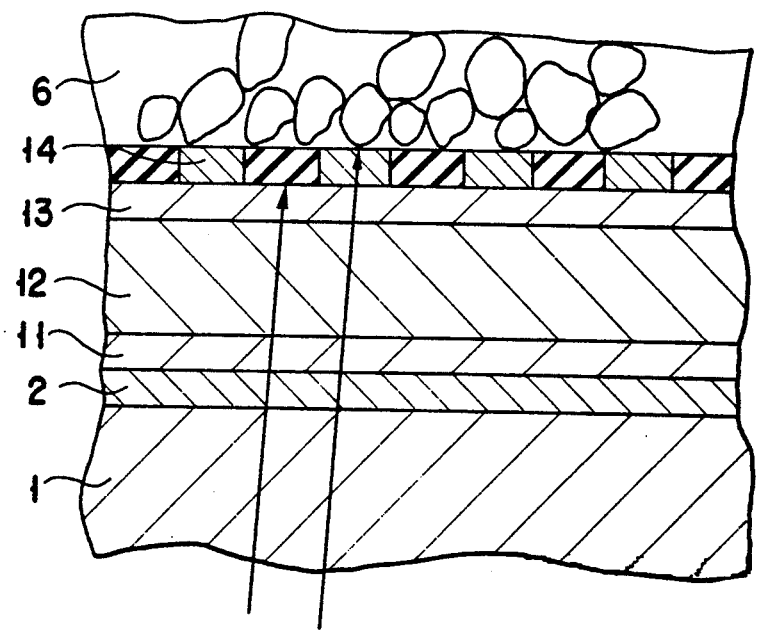
FIG. 6 is a schematic cross sectional view showing a dot layer and a non-transmitting insulating layer.

In the solid-state image converting element for converting the intermediate infrared ray and the far infrared ray, the EL light-emission due to propagation of the current or light in the PC layer 6 is positively used. Regarding the far infrared ray, since there is no need of the striped or reticulated electrode, propagation of the current in the PC layer 6 of the portion where no dot layer 14 exists makes resolution worse. Therefore, as shown in FIG. 6, non-transmitting insulting layer is formed between the dots such that incident light strikes on only the dots. Thereby, resolution of the visible image can be improved. As material for the dot-like non-transmitting insulating layer, for example, a mixture of $Pr_6O_{11}$, $Mn_2O_3$ and $Al_2O_3$ is used, and such the insulating layer can be formed by the lift off method or photoetching.

An example of the specific manufacture of the solid-state image converting device of the present invention will be explained as follows.

The ITO transparent electrode 2 having a thickness of 500Å formed on the glass plate having the thickness of 1 mm by spattering, the first insulating layer formed of $Ta_2O_3$ by spattering and having the thickness of 0.3 $\mu$m, the thin film EL layer formed of ZnS:Tb, F and having a thickness of 0.4 $\mu$m, and the second insulating layer formed of $Ta_2O_5$ and having the thickness of 0.3 $\mu$m were sequentially laminated.

Next, by sputtering, a dot layer was formed of ITO having a dot diameter of 100 $\mu$m$\phi$, a dot thickness of 0.1 $\mu$m, a pitch of 200 $\mu$m.

Further, sputtering is carried out, as a target, using a sintered body of a mixture in which 20 wt. % of $Al_2O_3$ is added to a mixture of $Mn_2O_3$ and $Pr_6O_{11}$ whose weight ratio is 4:5. Then, a non-transmitting insulating layer is formed between the dots of the dot layer 14 by lift-off method.

Slurry in which CdSe:Cu, Cl powder and cyanoethyl cellulose as an organic binder are mixed was applied by use of a squeegee and dried, so that a PC layer having a thickness of 150 $\mu$m was formed.

After drying the PC layer, an Al back electrode 7 having a thickness of 500Å was formed by vacuum deposition, and the solid-state image converting device of the present invention was obtained.

According to the above-obtained solid-state image converting device of the present invention, since the eectroluminescent layer is constituted by a thin film EL, the lifetime of the thin film EL is longer than the dispersion type EL, and uniform light-emitting surface can be obtained. Thereby, the conventional problems (1) and (3) can be solved.

Moreover, if the brightness voltage characteristic of the thin film EL is compared with that of the dispersion type EL, the thin film EL is superior in increasing rate of brightness from the light emission starting voltage. In other words, a voltage to be added to the light emission voltage, which is need to obtain the same brightness as that obtained by the dispersion type EL, is low in the thin film type EL. Since the solid-state image converting device of the present invention has the above-mentioned thin film EL, the brightness is good. This relates to the thickness of the PC layer 6. That is, in the conventional solid-state image converting device, in order to distribute much voltages to the electroluminescent layer, the quantity of incident light must be increased, or the PC layer 6 is thickened and resistance is enhanced, and high voltage must be applied. In the solid-state image converting device of the present invention, however, since the electroluminescent layer is the thin film EL, high brightness can be obtained by a small amount of voltages, so that the PC layer 6 may be thin. Therefore, the solid-state image converting device of the present invention can solve the conventional problem (2), and high brightness can be obtained by even a low voltage.

Moreover, the solid-state image converting device of the present invention can solve the conventional problem (4). Unlike the conventional device, the present device is not limited to the incident light image from the back surface, an incident light image even from the front can be converted into the visible image. Furthermore, since the PC layer can be directly excited from the back surface if the back electrode 7 is transparent, the conventional problem (5) can be solved. Moreover, if the back electrode 7 is stripe-formed or reticulately-formed an image having an intermediate infrared wavelength or more can be converted into a visible image.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A solid-state image converting device comprising:
   a transparent substrate;
   a transparent electrode formed on the transparent substrate;
   an EL layer, formed on the transparent electrode, emitting light by the application of an electric field;
   a dot-like low resistance layer formed on the EL layer;
   a photoconductive layer formed on the dot-like low resistance layer; and
   a back electrode formed on the photoconductive layer.

2. The solid-state image converting device according to claim 1, wherein said dot-like low resistance layer is formed of a metal selected from the group consisting of Al, Au, Pt, Zn, Ag, Cu, Ni, indium-tin oxides, aluminum doped zinc oxide, and tin oxide.

3. The solid state image converting device according to claim 1, wherein said dot-like low resistance layer is formed of light-transmitting material.

4. The solid-state image converting device according to claim 1, wherein a diameter of a dot of said dot-like low resistance layer is 20 to 300 μm, and a space between dots is 20 to 300 μm.

5. The solid-state image converting device according to claim 1, wherein said dot-like low resistance layer is formed by one of deposition, sputtering and lift off using a photoresist.

6. The solid-state image converting device according to claim 1, wherein a thickness of said dot-like low resistance layer is 0.005 to 5 μm.

7. The solid-state image converting device according to claim 6, wherein the thickness of said dot-like resistance layer is 0.1 to 1 μm.

8. The solid-state image converting device according to claim 1, wherein an X-ray image enters said back electrode.

9. The solid-state image converting device according to claim 1, wherein said back electrode is formed of light-transmitting material, and an infrared ray image enters said back electrode.

10. The solid-state image converting device according to claim 9, wherein a near infrared ray image enters said back electrode, and a non-transmitting insulating layer is formed between the dots of said dot-like low resistance layer.

11. The solid-state image converting device according to claim 10, wherein said non-transmitting insulating layer is formed of a mixture of $Pr_6O_{11}$, $Mn_2O_3$ and $Al_2O_3$.

12. The solid-state image converting device according to claim 9, wherein said transparent electrode is one of stripedly and reticulately formed, and an intermediate infrared ray image enters said transparent electrode.

13. The solid-state image converting device according to claim 1, wherein said back electrode is one of stripedly and reticulately formed, and one of an intermediate infrared ray image and a far infrared ray image enters said back electrode.

14. The solid-state image converting device according to claim 1, wherein said EL layer is formed of a phosphor layer sandwiched between two insulating layers.

* * * * *